(12) United States Patent  
Cha et al.

(10) Patent No.: US 12,362,204 B2
(45) Date of Patent: Jul. 15, 2025

(54) METHOD OF MANUFACTURING SEMICONDUCTOR DEVICE USING STATIONARY LASER MODULE

(71) Applicant: Samsung Electronics Co., Ltd., Suwon-si (KR)

(72) Inventors: Ji Hoon Cha, Seoul (KR); Jinwoo Lee, Yongin-si (KR); Seok Hoon Kim, Seongnam-si (KR); In Gi Kim, Hwaseong-si (KR); Seung Min Shin, Daejeon (KR); Yong Jun Choi, Gwacheon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 59 days.

(21) Appl. No.: 18/135,618

(22) Filed: Apr. 17, 2023

(65) Prior Publication Data
US 2023/0253218 A1 Aug. 10, 2023

Related U.S. Application Data

(63) Continuation of application No. 16/683,753, filed on Nov. 14, 2019, now Pat. No. 11,631,599.

(30) Foreign Application Priority Data

Feb. 1, 2019 (KR) .................. 10-2019-0013644

(51) Int. Cl.
*H01L 21/67* (2006.01)
*H01L 21/687* (2006.01)

(52) U.S. Cl.
CPC .. *H01L 21/67115* (2013.01); *H01L 21/67051* (2013.01); *H01L 21/68728* (2013.01); *H01L 21/68764* (2013.01)

(58) Field of Classification Search
CPC ......... H01L 21/67115; H01L 21/67051; H01L 21/68728; H01L 21/68764; H01L 21/6708; H01L 21/68792; H01L 21/31111; H01L 21/32134; H01L 21/68721
See application file for complete search history.

(56) References Cited

U.S. PATENT DOCUMENTS

| 7,237,561 | B2 | 7/2007 | Park et al. |
| 7,913,702 | B2 | 3/2011 | Moriya |
| 2016/0372317 | A1 | 12/2016 | Lee et al. |
| 2019/0311923 | A1* | 10/2019 | Kim .................. H01L 21/6708 |
| 2021/0060625 | A1* | 3/2021 | Shin .................. B08B 7/0042 |
| 2021/0118701 | A1* | 4/2021 | Chung ............. H01L 21/30604 |

FOREIGN PATENT DOCUMENTS

| JP | 2000-202385 A | 7/2000 |
| JP | 2014-160753 A | 9/2014 |
| JP | 2014-165248 A | 9/2014 |
| KR | 10-2015-0047206 A | 5/2015 |
| KR | 10-1571623 B1 | 11/2015 |
| KR | 10-2017-0047104 A | 5/2017 |
| KR | 10-2018-0014556 A | 2/2018 |
| KR | 10-201-80024924 A | 3/2018 |

* cited by examiner

*Primary Examiner* — John P. Dulka
(74) *Attorney, Agent, or Firm* — Muir Patent Law, PLLC

(57) ABSTRACT

An apparatus is provided. The apparatus includes a spinner configured to hold a wafer, a nozzle configured to supply a liquid chemical onto an upper surface of the wafer, and a laser module configured to heat the wafer by radiating a laser beam to a lower surface of the wafer while the nozzle supplies the liquid chemical onto the upper surface of the wafer.

13 Claims, 10 Drawing Sheets

METHOD OF MANUFACTURING SEMICONDUCTOR DEVICE USING STATIONARY LASER MODULE

This application is a Continuation Application of U.S. patent application Ser. No. 16/683,753, filed on Nov. 14, 2019 (now patented as U.S. Pat. No. 11,631,599), which claims priority under 35 U.S.C. § 119 to Korean Patent Application No. 10-2019-0013644, filed on Feb. 1, 2019, in the Korean Intellectual Property Office, the disclosure of each of which is incorporated herein in its entirety by reference.

BACKGROUND

1. Field

The present disclosure relates to a semiconductor device manufacturing apparatus, e.g., a wafer cleaning device or a wafer etching device, and a method of manufacturing semiconductor devices using the apparatus.

2. Description of the Related Art

A wet cleaning process used in a semiconductor manufacturing process is a process of etching, e.g., using a hard mask on a wafer and using a high-temperature liquid chemical. This wet cleaning process is performed by batch-type equipment in a conventional method. The batch-type equipment refers to equipment that wet-cleans one set of wafers, not one wafer, by simultaneously immersing the set of wafers in a liquid chemical.

The batch-type equipment may cause problems in wafers, such as flow defects, poor dry and bad dispersion uniformity. To address these problems, it has been considered/urged to switch to single-type equipment. The single-type equipment refers to equipment that applies a wet cleaning process to wafers one by one.

However, even in the single-type equipment, the dispersion of etch rates may not be uniform enough depending on the position of one wafer. Therefore, there is a need for a development of a wafer cleaning/etching device that may achieve a uniform dispersion of etch rates according to the position of a wafer.

SUMMARY

Aspects of the present disclosure provide a wafer etching/cleaning device capable of achieving a uniform dispersion of etch rates.

Aspects of the present disclosure also provide a wafer etching/cleaning method employed to achieve a uniform dispersion of etch rates.

However, the invention is not restricted to the embodiments set forth herein. The above and other aspects of the present disclosure will become more apparent to one of ordinary skill in the art to which the present disclosure pertains by referencing the detailed description of the present disclosure given below.

According to an exemplary embodiment of the present inventive concept, there is provided an apparatus. The apparatus includes a spinner configured to hold a wafer, a nozzle configured to supply a liquid chemical onto an upper surface of the wafer, and a laser module configured to heat the wafer by radiating a laser beam to a lower surface of the wafer.

According to an exemplary embodiment of the present inventive concept, there is provided an apparatus. The apparatus includes a spinner configured to hold sides of a wafer the spinner configured to rotate together with the wafer, a nozzle configured to supply a liquid chemical onto an upper surface of the wafer, a housing spaced apart from the spinner, a hollow formed in the housing, a laser module disposed at a bottom of the hollow, the laser module configured to radiate a laser beam that passes through the hollow, a blocking film formed at a bottom of the hollow, the blocking film configured to block a laser beam, and a transparent window disposed at a top of the hollow, the transparent window configured to transmit the laser beam.

According to an exemplary embodiment of the present inventive concept, there is provided an apparatus. The apparatus includes a hollow formed in a housing, a laser module configured to radiate a laser beam, a grip configured to hold a wafer, and a transparent window disposed at a top of the hollow to seal the hollow, the transparent window positioned to transmit the laser beam, wherein the transparent window is positioned adjacent to a lower surface of the wafer, and wherein the laser module is configured to heat the wafer by irradiating the entire lower surface of the wafer to the laser beam.

According to an exemplary embodiment of the present inventive concept, there is provided a method of manufacturing a semiconductor device. The method includes placing a wafer above a housing by holding the wafer with a spinner on sides of the wafer, supplying a liquid chemical onto the wafer, rotating the wafer using the spinner to evenly spread the liquid chemical on an upper surface of the wafer, and heating the wafer with a first laser beam radiated from a laser module disposed in the housing.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

A wafer cleaning device according to embodiments will now be described with reference to FIGS. 1 through 6. Wafer cleaning devices described in the present disclosure may be wafer etching devices. For example, the wafer cleaning devices may perform etching processes forming patterns on wafers by using etchant chemical liquids. The wafer cleaning devices may also perform cleaning processes which maintain patterns formed on the wafers. The wafer cleaning process may use water and/or cleaning chemical liquid to perform the cleaning processes.

Figure 1:
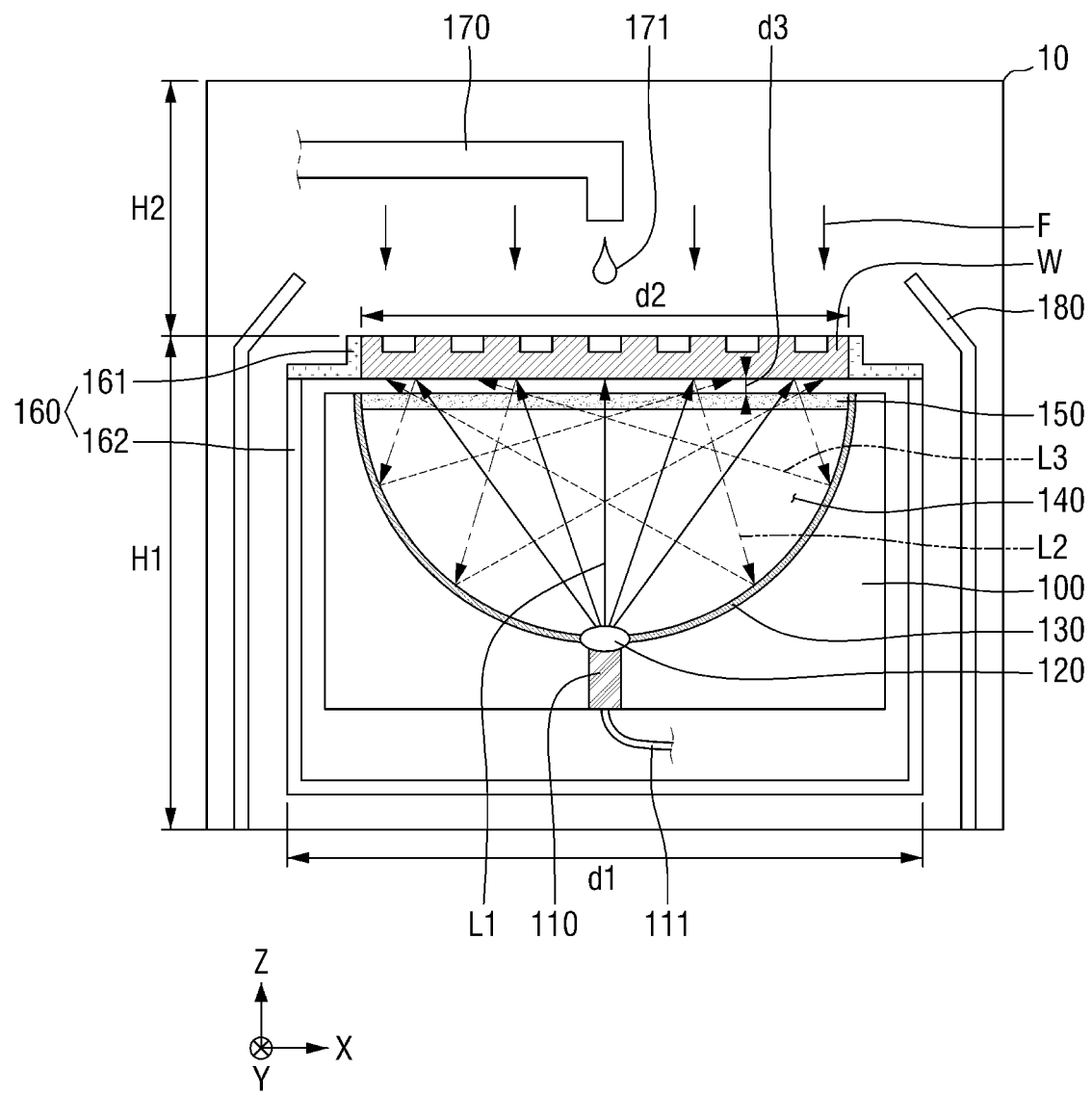
FIG. 1 is a cross-sectional view of a wafer cleaning/etching device according to some embodiments.
Figure 2:
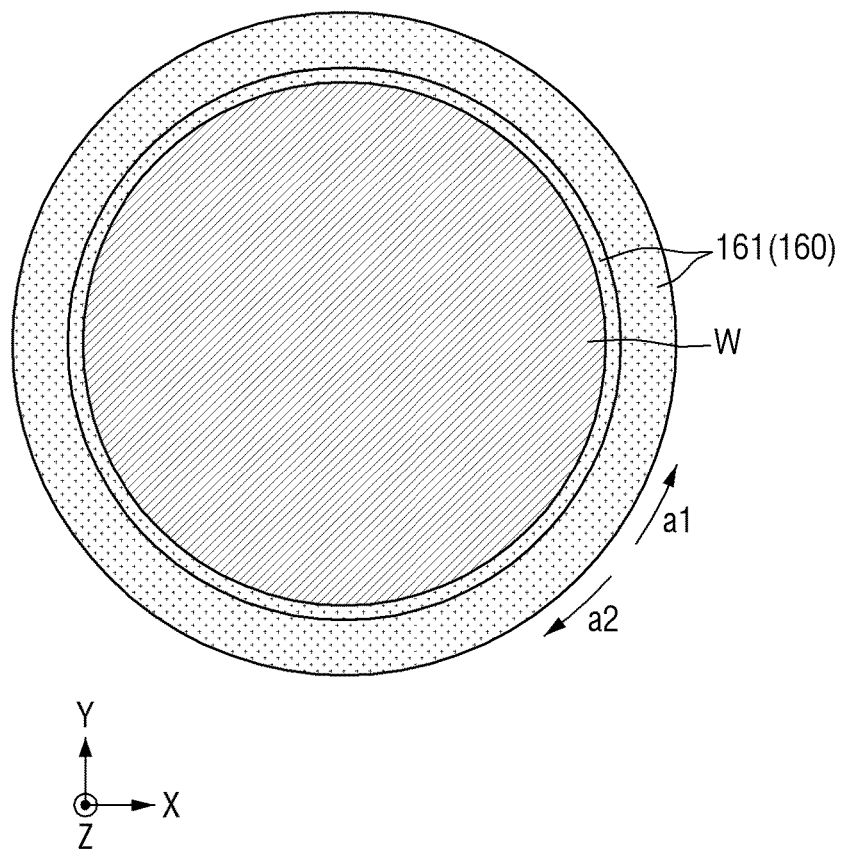
FIG. 2 is a detailed plan view of the wafer cleaning/etching device of FIG. 1.

FIG. 1 is a cross-sectional view of a first wafer cleaning device 10 according to some embodiments. FIG. 2 is a detailed plan view of the first wafer cleaning device 10 of FIG. 1. Referring to FIGS. 1 and 2, the first wafer cleaning device 10 according to the embodiments may include a housing 100, a first spinner 160, a nozzle 170, a bowl 180, a laser module 110, a hollow region 140, a reflective plate 130, and a transparent window 150. The hollow region 140 described herein may be a hollow formed by a space enclosed by a wall made of a solid structure.

A first direction X may be any one direction among horizontal directions. A second direction Y may be any one direction among horizontal directions different from the first direction X. The second direction Y may intersect the first direction X. For example, the second direction Y may be a direction perpendicular to the first direction X. A third direction Z may be a direction intersecting the first direction X and the second direction Y. For example, the third direction Z may be a direction perpendicular to both the first direction X and the second direction Y. The third direction Z may be, for example, a vertical direction. Accordingly, the first direction X, the second direction Y, and the third direction Z may be orthogonal to each other.

The housing 100 may be located under a wafer W. For example, the housing 100 and the wafer W may be arranged spaced apart in the third direction Z. The housing 100 may warm and/or heat the wafer, e.g., a lower surface of the wafer W. An upper surface of the housing 100 may be adjacent to the lower surface of the wafer W. However, the housing 100 and the wafer W may not contact each other. The wafer W described herein may be a semiconductor wafer, e.g., a silicon wafer or a germanium wafer, or may be a substrate other than a semiconductor wafer.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present.

The laser module 110, the hollow region 140, the reflective plate 130 and the transparent window 150 may be included in the housing 100. For example, the laser module 110, the hollow region 140, the reflective plate 130 and the transparent window 150 may be disposed inside the housing 100. The housing 100 may serve to fix and support the positions of the laser module 110, the hollow region 140, the reflective plate 130 and the transparent window 150.

The housing 100 may be fixed in a position under the wafer W. Therefore, even if the wafer W rotates in a first rotation direction a1 or a second rotation direction a2, the housing 100 may not rotate. However, the current embodiments are not limited to this case. In a wafer cleaning device according to certain embodiments, the housing 100 may also rotate together with the wafer W or may rotate separately.

The first spinner 160 may contact sides of the wafer W. The first spinner 160 may rotate the wafer W while holding the wafer W on the sides of the wafer W. As the first spinner 160 rotates in the first rotation direction a1 or the second rotation direction a2, the wafer W may also rotate in the same direction.

When the wafer W rotates along with the first spinner 160, a liquid chemical 171 supplied onto an upper surface of the wafer W may be evenly spread on the upper surface of the wafer W. The rotation of the wafer W along with the first spinner 160 may help the upper surface of the wafer W have a uniform etch rate.

The first spinner 160 may include a grip portion 161 and a support portion 162. The grip portion 161 may be a portion that contacts/touches the sides of the wafer W. The grip portion 161 may hold the wafer W by directly hold (e.g., contacting) the sides of the wafer W. Accordingly, the grip portion 161 may rotate in the first rotation direction a1 or the second rotation direction a2 together with the wafer W. The grip portion 161 described herein may be a grip or a holder designed to hold or grip the wafer W. The support portion 162 described herein may be a support designed to support the grip or the holder, e.g., from under the grip or the holder. For example, the support may be combined with the grip or the holder. In certain embodiments, the grip portion 161 and the support portion 162 of the first spinner 160 may be formed integrally.

The grip portion 161 may include a heat insulating material. When the wafer W is warmed and/or heated by various elements (e.g., the laser module 110) in the housing 100, the grip portion 161 may block transfer of heat, thereby preventing thermal damage to other parts of the first wafer cleaning device 10.

The support portion 162 may be connected to the grip portion 161. The support portion 162 may extend downward from the grip portion 161. The support portion 162 may support the grip portion 161. The support portion 162 may cover an outer surface of the housing 100.

The support portion 162 may rotate in the first rotation direction a1 or the second rotation direction a2 together with the grip portion 161. Here, the whole of the support portion 162 may rotate, or only a part of the support portion 162 may rotate. When only a part of the support portion 162 rotates, the rotating part may be a part of the support portion 162 which is connected to the grip portion 161. Therefore, the wafer W may rotate in the first rotation direction a1 or the second rotation direction a2, e.g., together with the grip portion 161 and the part of the support portion 162 which is connected to the grip portion 161.

The first spinner 160 may rotate the wafer W in the first rotation direction a1 or the second rotation direction a2 at an appropriate speed. This is because when the rotation speed of the first spinner 160 is too high, an edge portion of the wafer W is relatively cooled, leading to a non-uniform distribution of temperature. In this case, the etch rate may also be different in a central portion from the edge portion of the wafer W.

Therefore, the rotation speed of the first spinner 160 may be limited to 100 to 300 rpm. However, the invention is not limited to this case.

The nozzle 170 may be located above the wafer W and the first spinner 160. The nozzle 170 may supply the liquid chemical 171 to the upper surface of the wafer W. The nozzle 170 may drop the liquid chemical 171 onto the central portion of the wafer W, e.g., at the center of the upper surface of the wafer W. As the wafer W rotates, the dropped liquid chemical 171 may be spread over the entire upper surface of the wafer W. The first wafer cleaning device 10 may apply a flow F in a downward direction in order to fix/stabilize the wafer W in position and uniformly spread the liquid chemical 171. Therefore, the liquid chemical 171 may move from the center of the upper surface of the wafer W to the periphery. For example, the flow F may be a gas flow. For example, the flow F may include $N_2$ gas.

The nozzle 170 sprays the liquid chemical 171 in the downward direction from above the upper surface of the wafer W in FIG. 1. However, the present disclosure is not limited to this case. In some embodiments, the nozzle 170 may be disposed on a side of the wafer W at a position higher than the upper surface of the wafer W. In certain embodiments, the nozzle 170 may supply the liquid chemical 171 to the upper surface of the wafer W by ejecting the liquid chemical 171 in a lateral direction, e.g., by applying a high pressure to the liquid chemical 171 to eject the liquid chemical 171 from the nozzle 170. For example, the liquid chemical 171 may be sprayed to the upper surface or the wafer W by the high pressure applied to the liquid chemical 171.

The liquid chemical 171 may be a solution for etching the upper surface of the wafer W, e.g., to form a pattern on the wafer W. For example, SiN or polysilicon contained in the wafer W may be a material to be etched.

The liquid chemical 171 may vary according to a material to be etched. The liquid chemical 171 may include at least one of, but not limited to, phosphoric acid, ammonia water, and tetramethylammonium hydroxide.

The liquid chemical 171 is supplied by the nozzle 170. The nozzle 170 may eject the liquid chemical 171 onto the upper surface of the wafer W at an appropriate amount and rate. This is because if the liquid chemical 171 is provided too much or too fast, the temperature rise of the wafer W may be slowed down too much. Therefore, the nozzle 170 may provide the liquid chemical 171 onto the wafer W at a rate of, but not limited to, 0.1 L/min to 1 L/min.

The upper surface of the wafer W fixed/anchored by the first spinner 160 may be located at a position higher than a lower surface of the first wafer cleaning device 10 by a first height H1.

The bowl 180 may be located outside the wafer W, the first spinner 160 and the housing 100. The bowl 180 may extend in the third direction Z to a position higher than the upper surface of the wafer W. The bowl 180 may block the outflow of the liquid chemical 171 and fumes produced by the vaporization of the liquid chemical 171. The bowl 180 may prevent/protect other parts of the first wafer cleaning device 10 from being damaged by the liquid chemical 171 and the fumes.

The elements in the housing 100 will now be described in detail.

The laser module 110 may be disposed inside the housing 100. The laser module 110 may radiate a laser beam from under the wafer W to the lower surface of the wafer W. The laser module 110 may be located under the hollow region 140. For example, the laser module 110 may be disposed at the bottom of the hollow region 140. A first laser beam L1 radiated by the laser module 110 may pass through the hollow region 140 and the transparent window 150 to reach the lower surface of the wafer W.

The laser module 110 may include an optical fiber 111 and an aspherical lens 120. A laser beam of the laser module 110 may be supplied through the optical fiber 111. The optical fiber 111 may be connected to the outside so as to form a path through which a laser beam is supplied.

The first wafer cleaning device 10 may have sizes in a unit of cm. For example, first width d1 of the first spinner 160 in the first direction X may be, but is not limited to, 35 to 40 cm. For example, the first width d1 of the first spinner 160 may correspond to the diameter of the first spinner 160. The first height H1 may be, but is not limited to, 50 to 70 cm. A second height H2 from the upper surface of the wafer W and/or from a top surface of the first spinner 160 to a top of the first wafer cleaning device 10 may be, but is not limited to, 30 cm. For example, the top surface of the first spinner 160 and the top surface of the wafer W may be coplanar.

The laser module 110 should not be too large because it supplies a laser beam into the first wafer cleaning device 10. Therefore, it may be beneficial to supply a laser beam through the optical fiber 111 instead of a module for supplying a laser beam using a mirror that may use a relatively long reflection distance. However, the invention is not limited to this case.

The laser module 110 may include additional lenses e.g., in addition to the aspherical lens 120 described above. For example, the additional lenses may include aspherical lenses and/or spherical lenses. The aspherical lens 120 may process/change the profile of a laser beam supplied by the optical fiber 111 e.g., in combination with the additional lenses. This will be described in more detail later.

The hollow region 140 may be located inside the housing 100. The hollow region 140 may be an empty space inside the housing 100. The hollow region 140 may be a region where the first laser beam L1 radiated by the laser module 110 travels to the lower surface of the wafer W.

An upper portion of the hollow region 140 may be covered by the transparent window 150. Accordingly, the hollow region 140 may be completely isolated from the outside by the housing 100 and the transparent window 150. This may be intended to prevent the laser module 110 and the hollow region 140 from being contaminated by the liquid chemical 171 and the fumes generated by the liquid chemical 171.

The inside of the hollow region 140 may be a vacuum. For example, the hollow 140 may be maintained to be a vacuum state while an etching process is performed by the cleaning/etching device 10. Therefore, the first laser beam L1 may easily travel in the hollow region 140. However, the invention is not limited to this case, and the inside of the hollow region 140 may be filled with a gas medium that does not hinder the travel of the first laser beam L1.

The hollow region 140 may be hemispherical. For example, the hollow region 140 may be surrounded by the reflective plate 130 at a side portion and a bottom portion, and by the transparent window 150 at an upper portion of the hollow region 140. For example, the hollow region 140 may be formed in a hemispherical shape so that a second laser beam L2 generated by the reflection of the first laser beam L1 by the lower surface of the wafer W may be reflected by the reflective plate 130, e.g., toward the wafer W. Therefore, a third laser beam L3 generated by the reflection of the second laser beam L2 by the reflective plate 130 may efficiently reach the lower surface of the wafer W.

The reflective plate 130 may be disposed at and/or surround a bottom portion of the hollow region 140. The reflective plate 130 may reflect the second laser beam L2 generated by the reflection of the first laser beam L1 radiated from the laser module 110 by the lower surface of the wafer W. Accordingly, the third laser beam L3 generated by the reflection of the second laser beam L2 by the reflective plate 130 may reach the lower surface of the wafer W.

The second laser beam L2 generated by the reflection of the first laser beam L1 may damage the first wafer cleaning device 10 when reaching other parts of the first wafer cleaning device 10. Therefore, the reflective plate 130 may serve to prevent the second laser beam L2 from reaching other parts of the first wafer cleaning device 10. At the same time, the reflective plate 130 may make the third laser beam L3 reach the lower surface of the wafer W by reflecting the second laser beam L2, thereby improving the warming efficiency of the wafer W.

The transparent window 150 may be located in the upper surface/portion of the housing 100. For example, the transparent window 150 may seal the upper portion of the housing 100. The transparent window 150 may cover the top of the hollow region 140. The transparent window 150 may be made of a transparent material through which the first laser beam L1, the second laser beam L2, and the third laser beam L3 may pass through the transparent window 150. For example, the transparent window 150 may be made of a quartz material.

The transparent window 150 may be adjacent to the wafer W. A gap between the transparent window 150 and the wafer W may be a third width d3. The third width d3 may be relatively small as compared with the first width d1, a second width d2, the first height H1 and the second height H2. Therefore, the first laser beam L1, the second laser beam L2 and the third laser beam L3 may not leak to other places than the lower surface of the wafer W.

However, the transparent window 150 and the wafer W may not contact each other. This is because the wafer W needs to be rotated by the first spinner 160, whereas the housing 100 equipped with the transparent window 150 may not rotate.

Since it is beneficial that the entire lower surface of the wafer W is uniformly warmed or heated, the lower surface of the wafer W and an interface of the transparent window 150 may correspond to each other. For example, the edge portion of the wafer W may also be exposed to the first laser beam L1 and the third laser beam L3 through the transparent window 150. For example, the edge of the wafer W may overlap the edge of the transparent window 150 in a plan view.

Figure 3:
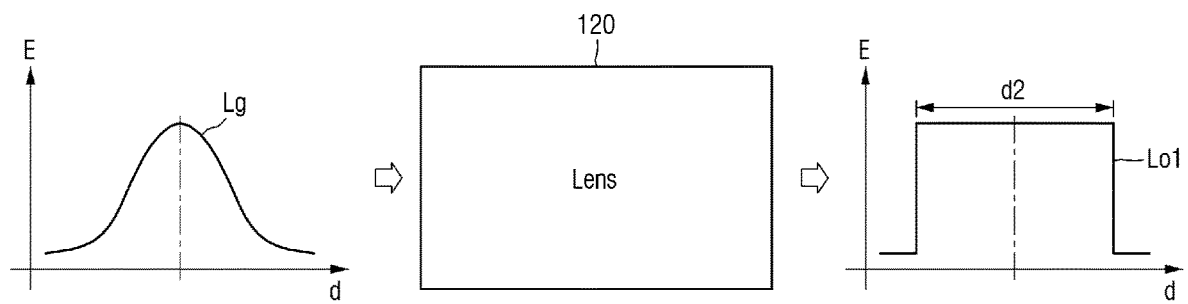
FIG. 3 is a conceptual diagram illustrating an operation of an aspherical lens of FIG. 1.

FIG. 3 is a conceptual diagram illustrating the operation of the aspherical lens 120 of FIG. 1.

Referring to FIGS. 1 through 3, the aspherical lens 120 may process a laser beam. For example, the first laser beam L1 supplied by the optical fiber 111 may have a Gaussian profile Lg. For example, the first laser beam L1 may have a Gaussian energy profile E with respect to distance d, e.g., when the first laser beam L1 emits from the optical fiber 111.

The Gaussian profile Lg of the first laser beam L1 may be converted into a first output profile Lo1 as the first laser beam L1 passes through the aspherical lens 120. Referring to the first output profile Lo1, a uniform energy E may be supplied to the entire lower surface of the wafer W, which corresponds to the second width d2, regardless of the distance d.

Therefore, the first wafer cleaning device 10 may make the temperature of the wafer W uniform, thereby obtaining a uniform etch rate throughout the wafer W.

The first output profile Lo1 may be the profile of the first laser beam L1. In certain embodiments, the first output profile Lo1 may be the sum of the profile of the first laser beam L1 and the profile of the third laser beam L3. For example, when the third laser beam L3 is not substantial, the profile of the first laser beam L1 and the sum of the profile of the first laser beam L1 and the profile of the third laser beam L3 may be substantially the same. Since the sum of the profiles of the first laser beam L1 and the third laser beam L3 is a laser beam actually applied to the lower surface of the wafer W, the first wafer cleaning device 10 may perform an etching process uniformly by using this laser beam.

When the first output profile Lo1 is the sum of the profiles of the first laser beam L1 and the third laser beam L3, the shape of the hollow region 140 as well as the design of the aspherical lens 120 may be parameters for the first output profile Lo1. For example, the first wafer cleaning device 10 may adjust the first output profile Lo1 uniformly through the curvature of a hemispherical surface of the hollow region 140 and the design of the aspherical lens 120. For example, the curvature of the hemispherical surface and the aspherical lens 120 may be designed for the cleaning device 10 to output a uniform profile like the first output profile Lo1. For example, the aspherical lens 120 may be designed in consideration of the curvature of the hemispherical surface, and vice versa.

Figure 4:
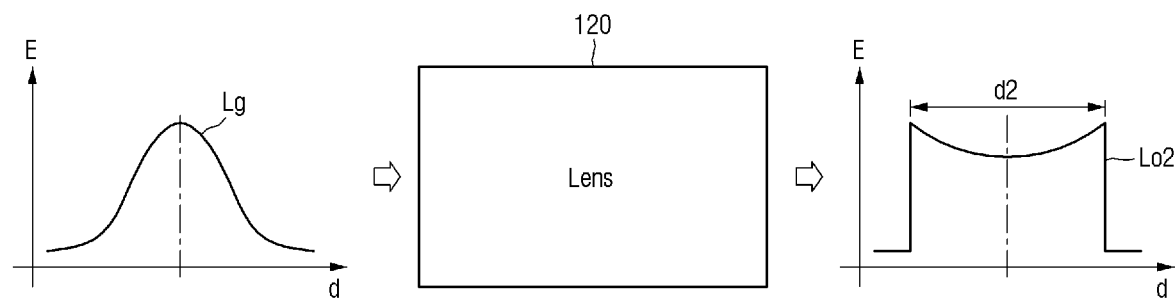
FIG. 4 is a conceptual diagram illustrating the operation of an aspherical lens of a wafer cleaning/etching device according to some embodiments.

FIG. 4 is a conceptual diagram illustrating an operation of an aspherical lens 120 of a first wafer cleaning device 10 according to some embodiments.

Referring to FIG. 4, the first wafer cleaning device 10 according to the embodiments may convert the Gaussian profile Lg of the first laser beam L1 into a second output profile Lo2 through the aspherical lens 120. The second output profile Lo2 may be the profile of the first laser beam L1, or may be the sum of the profile of the first laser beam L1 and the profile of the third laser beam L3.

The second output profile Lo2 may be a profile obtained by increasing the energy E reaching the edge portion of the wafer W. The second output profile Lo2 may increase the temperature of the edge portion of the wafer W. The first wafer cleaning device 10 may have the downward flow F on the upper surface of the wafer W. Since the flow F moves to outside the wafer W through the edge of the wafer W, the edge portion of the wafer W may be cooled unintentionally.

To offset this, the first wafer cleaning device 10 may adjust the sum of the profiles of the first laser beam L1 and the third laser beam L3 to the second output profile Lo2 by adjusting, e.g., the curvatures of the aspherical lens 120 and/or the reflective plate 130.

Figure 5:
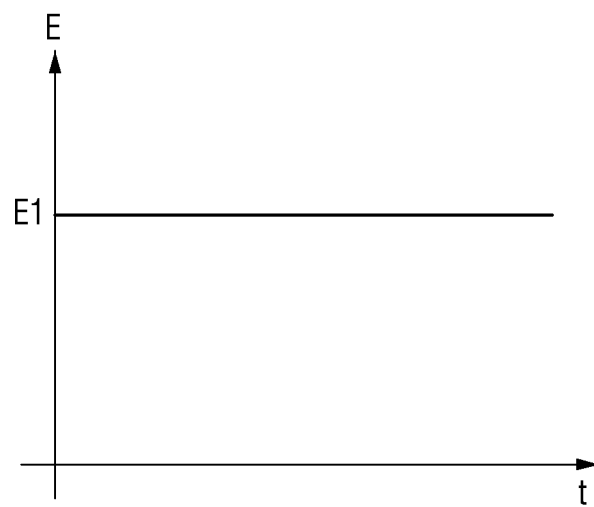
FIG. 5 is a graph illustrating a laser type of a laser module of FIG. 1.

FIG. 5 is a graph illustrating a laser type of the laser module 110 of FIG. 1.

Referring to FIGS. 1 and 5, the first laser beam L1 of the laser module 110 may be of a continuous wave type. The continuous wave type is the opposite of a pulse type and refers to a laser beam radiated continuously without being turned on and off. Here, the frequency or wavelength component of the laser beam itself also exists in the continuous wave type.

The first laser beam L1 of the laser module 110 may be radiated continuously with a magnitude of a first energy E1. The first laser beam L1 may be radiated constantly with the first energy E1 without varying in magnitude of energy over time.

The laser module 110 of the first wafer cleaning device 10 according to the embodiments may increase the efficiency of temperature rise by using a laser beam of the continuous wave type. Therefore, the etch rate of the first wafer cleaning device 10 may also be increased.

Figure 6:
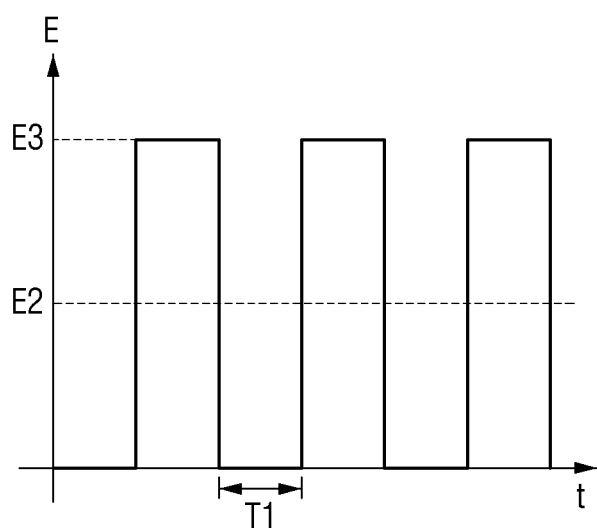
FIG. 6 is a graph illustrating a laser type of a laser module of a wafer cleaning/etching device according to some embodiments.

FIG. 6 is a graph illustrating a laser type of a laser module 110 of a first wafer cleaning device 10 according to some embodiments.

Referring to FIG. 6, the first laser beam L1 of the laser module 110 of the first wafer cleaning device 10 according to the embodiments may be of a pulse type. The pulse type is the opposite of the continuous wave type and refers to a laser beam radiated discontinuously by being periodically turned on and off. Apart from the on/off frequency, the frequency or wavelength component of the laser beam itself also exists in the pulse type when the laser beam is turned on.

The first laser beam L1 of the laser module 110 may be periodically radiated in the form of pulses with a magnitude of a third energy E3. An average energy of the first laser beam L1 may be a second energy E2. An interval between the pulses of the first laser beam L1 may be a first interval T1.

The first interval T1 may be in a unit of several nanoseconds or several picoseconds. For example, the frequency of the first laser beam L1 of the pulse type may be 10 to 1000 MHz. A too low frequency may not be suitable because the wafer W may be physically perforated instead of being warmed, e.g., when the third energy E3 is too high.

In the case of the first laser beam L1 of the pulse type, the intensity of warming may be adjusted by adjusting/changing the frequency, e.g., pulse frequency, of the first laser beam L1 of the pulse type without adjusting/changing the energy of the first laser beam L1.

The laser module 110 of the first wafer cleaning device 10 according to the embodiments may easily perform temperature control through frequency adjustment using a laser beam of the pulse type. Therefore, the first wafer cleaning device 10 may perform a precise etching process.

A second wafer cleaning device 11 according to some embodiments will now be described with reference to FIG. 7. Descriptions of elements and features identical to those of the above-described embodiments will be given briefly or omitted.

Figure 7:
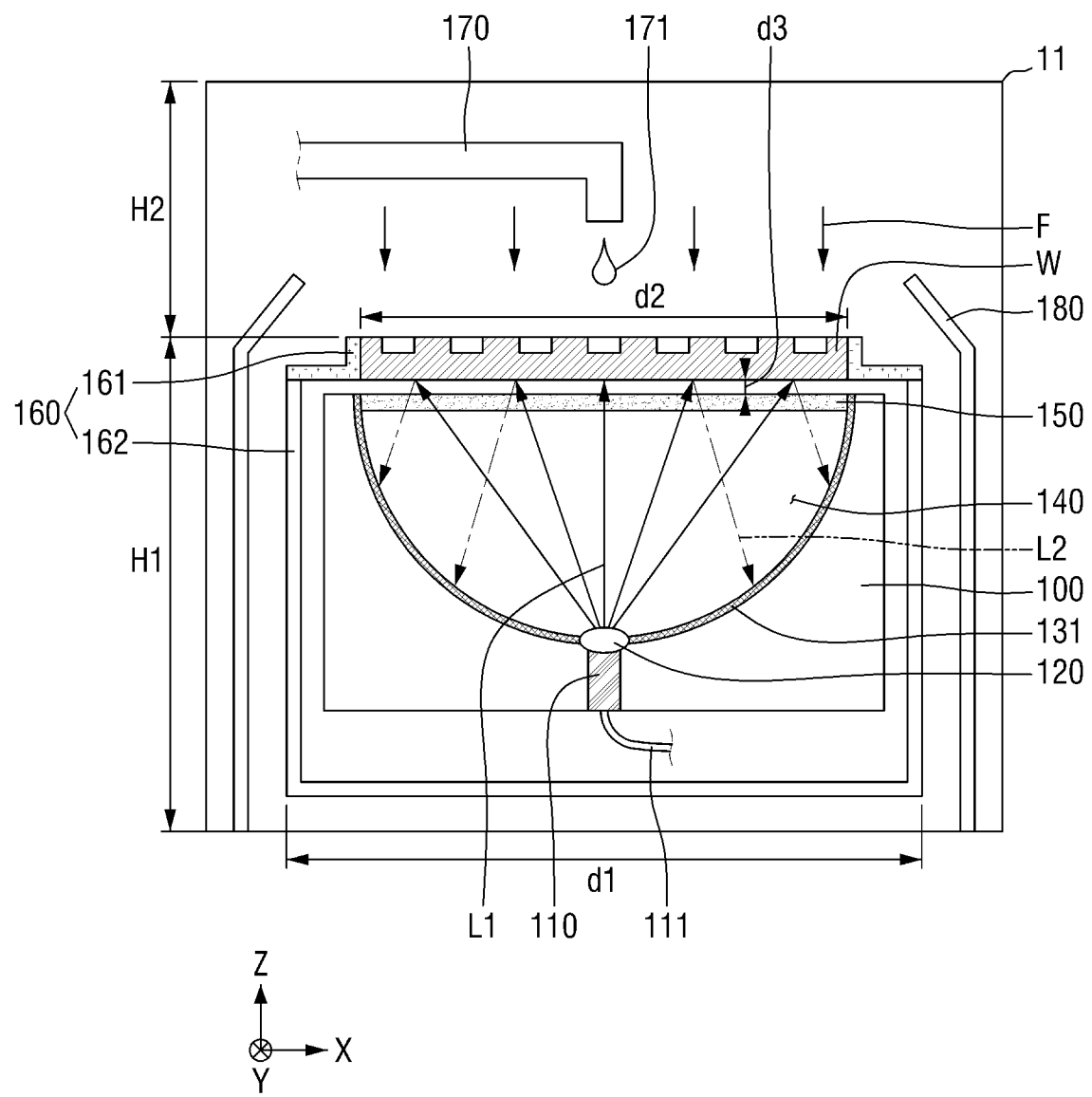
FIG. 7 is a cross-sectional view of a wafer cleaning/etching device according to some embodiments.

FIG. 7 is a cross-sectional view of a second wafer cleaning device 11 according to some embodiments.

Referring to FIG. 7, the second wafer cleaning device 11 according to the embodiments may include a first light-absorbing plate 131.

The first light-absorbing plate 131 may be formed at a bottom and a side of a hollow region 140. The first light-absorbing plate 131 may absorb a second laser beam L2 generated by the reflection of a first laser beam L1 by a lower surface of a wafer W.

The second laser beam L2 may be a laser beam generated as a portion of the first laser beam L1 is reflected by the lower surface of the wafer W. The second wafer cleaning device 11 may be damaged if the second laser beam L2 reaches other parts of the second wafer cleaning device 11. To prevent this, the first light-absorbing plate 131 of the second wafer cleaning device 11 according to the embodiments may absorb all of the second laser beam L2. For example, all of the second laser beam L2 being absorbed by the first light-absorbing plate 131 as described herein may refer to an absorbance of substantially all of the second laser beam L2 by the first light-absorbing plate 131. For example, the absorbance of substantially all of the second laser beam L2 may refer to an absorbance of 99% or more of the second laser beam L2 by the first light-absorbing plate 131.

The hollow region 140 and a transparent window 150 may be disposed adjacent to the lower surface of the wafer W. For example, a third width d3 may be relatively small as compared with a first width d1, a second width d2, a first height H1, and a second height H2. Accordingly, the second laser beam L2 may not leak between the transparent window 150 and the wafer W. Therefore, all of the second laser beam L2 may enter the hollow region 140. For example, substantially all (e.g., 99% or more) of the second laser beam L2 may enter the hollow region 140. Then, the second laser beam L2 may all be absorbed by the first light-absorbing plate 131.

Since the first light-absorbing plate 131 is located on the entire portions of the side and the bottom of the hollow region 140, all of the second laser beam L2 may be absorbed by the first light-absorbing plate 131.

The second wafer cleaning device 11 according to the embodiments can warm or heat the lower surface of the wafer W by using the first laser beam L1. For example, the wafer W may be heated or warmed by radiating the first laser beam L1 to the lower surface of the wafer W. Therefore, it may be beneficial to warm or heat the wafer W more intuitively and easily by considering the profile of the first laser beam L1 without considering reflected waves. Therefore, a more precise etching process may be performed.

A third wafer cleaning device 12 according to some embodiments will now be described with reference to FIG. 8. Descriptions of elements and features identical to those of the above-described embodiments will be given briefly or omitted.

Figure 8:
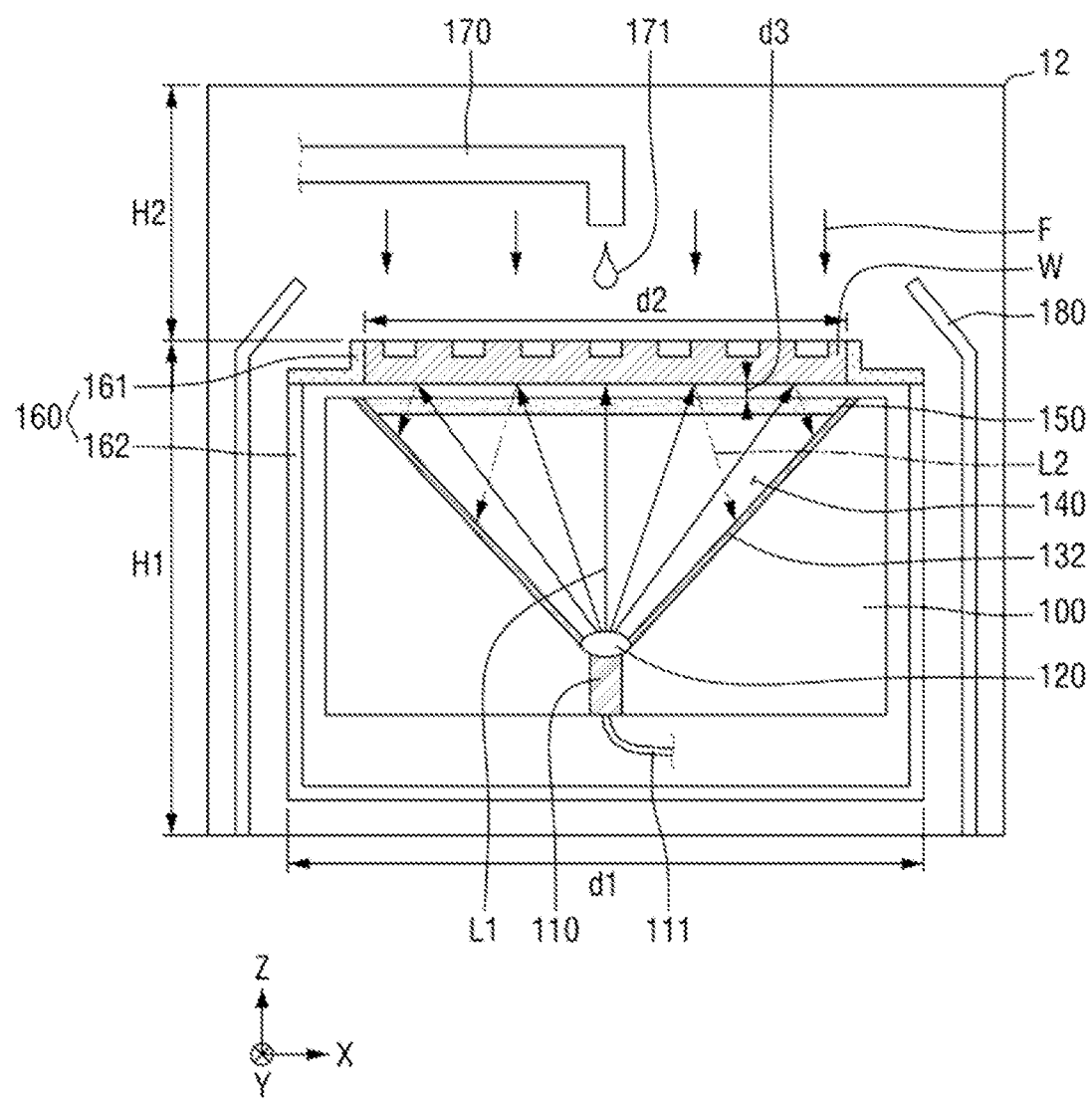
FIG. 8 is a cross-sectional view of a wafer cleaning/etching device according to some embodiments.

FIG. 8 is a cross-sectional view of a third wafer cleaning device 12 according to some embodiments.

Referring to FIG. 8, the third wafer cleaning device 12 according to the embodiments may include a funnel-shaped hollow region 140 and a second light-absorbing plate 132.

The second light-absorbing plate 132 may be formed along a side and a bottom portions of the hollow region 140, e.g., in a funnel shape. The second light-absorbing plate 132 may absorb a second laser beam L2 generated by the reflection of a first laser beam L1 by a lower surface of a wafer W.

The hollow region 140 and a transparent window 150 may be disposed adjacent to the lower surface of the wafer W. For example, a third width d3 may be relatively small as compared with a first width d1, a second width d2, a first height H1, and a second height H2. Accordingly, the second laser beam L2 may not leak between the transparent window 150 and the wafer W. Therefore, all of the second laser beam L2 may enter the hollow region 140. For example, substantially all (e.g., 99% or more) of the second laser beam L2 may enter the hollow region 140. Then, the second laser beam L2 may all be absorbed by the second light-absorbing plate 132.

Since the second light-absorbing plate 132 is located at the entire bottom and side portions of the hollow region 140, all of the second laser beam L2 may be absorbed by the second light-absorbing plate 132.

When the hollow region 140 includes a reflective plate 130 instead of the second light-absorbing plate 132, the hollow region 140 may be formed in a hemispherical shape in consideration of a laser beam reflected by the reflective plate 130.

Since the third wafer cleaning device 12 according to the embodiments uses the second light-absorbing plate 132, there is no need to widen the hollow region 140 and to form the hollow region 140 in a hemispherical shape.

For example, the hollow region 140 may block/absorb all of the second laser beam L2 generated by the reflection of the first laser beam L1 by the lower surface of the wafer W without consideration of the re-reflection of a laser beam. Therefore, the hollow region 140 may be formed in a funnel shape, not in a hemispherical shape.

The second light-absorbing plate 132 at the bottom of the hollow region 140 may absorb all of the second laser beam L2, thereby preventing/protecting the third wafer cleaning device 12 from being damaged by the second laser beam L2.

Therefore, the third wafer cleaning device 12 according to the embodiments may save space inside a housing 100. Consequently, a smaller-scale third wafer cleaning device 12 may be provided.

A fourth wafer cleaning device 13 according to some embodiments will now be described with reference to FIGS. 9 through 11. Descriptions of elements and features identical to those of the above-described embodiments will be given briefly or omitted.

Figure 9:
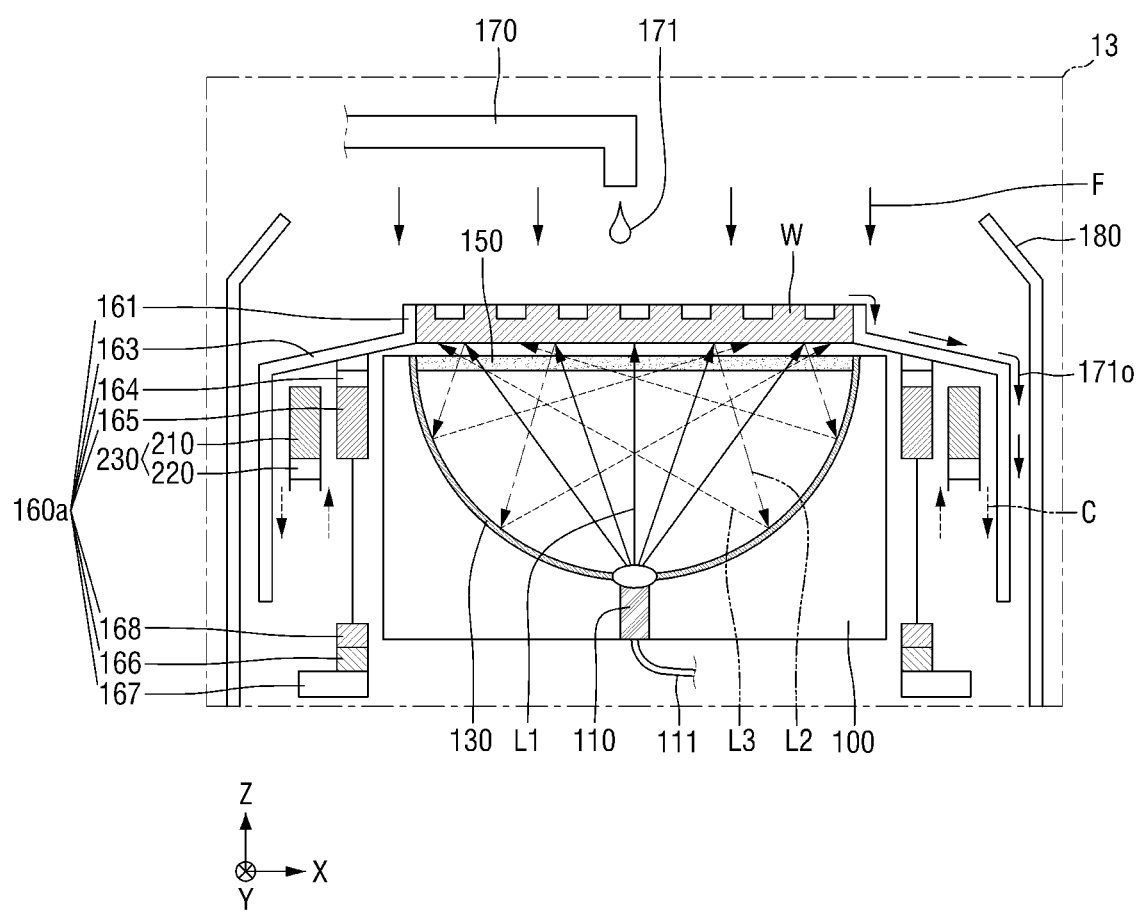
FIG. 9 is a cross-sectional view of a wafer cleaning/etching device according to some embodiments.

FIG. 9 is a cross-sectional view of a fourth wafer cleaning device 13 according to some embodiments. FIG. 10 is a conceptual diagram illustrating the operation of first and second rotors 165 and 210 of FIG. 9.

Referring to FIG. 9, the fourth wafer cleaning device 13 according to the embodiments may include a second spinner 160a, a grip portion 161, a chemical drain guide 163, a heat insulating block 164, the first rotor 165, a sidewall portion 168, a bearing 166, and a fixing portion 167. In addition, the fourth wafer cleaning device 13 may include a fixed rotor module 230. The fixing portion 167 described herein may be a fixture which does not move while the etching process is performed with a wafer/substrate.

The grip portion 161 may be a portion that contacts sides of a wafer W. The grip portion 161 may hold the wafer W by directly hold (e.g., contacting) the sides of the wafer W. For example, the grip portion 161 may rotate in the first rotation direction a1 or the second rotation direction a2 of FIG. 2, together with the wafer W.

The grip portion 161 may include a heat insulating material. When the wafer W is warmed or heated by various elements (e.g., a laser module 110) in a housing 100, the grip portion 161 may block transfer of heat, thereby preventing thermal damage to other parts of the fourth wafer cleaning device 13.

The chemical drain guide 163 may guide a drain path of a liquid chemical 171. The chemical drain guide 163 may be connected to the grip portion 161. The liquid chemical 171 may be pushed to the sides of the wafer W by a flow F after being used in an etching process performed on an upper surface of the wafer W.

Then, the liquid chemical 171 may reach the chemical drain guide 163 via the grip portion 161 on the sides of the wafer W and become a discharge liquid chemical 1710. The discharge liquid chemical 1710 may be discharged to the outside along the chemical drain guide 163.

Since the chemical drain guide 163 is located at a position lower than a bowl 180, the bowl 180 may prevent the liquid chemical 171 and the discharge liquid chemical 1710 from leaking to the outside, e.g., outside of the bowl 180. This may increase the durability of the fourth wafer cleaning device 13 and prevent the damage by the discharge liquid chemical 1710.

The chemical drain guide 163 may be disposed at a farther/outer portion from the wafer W than other elements of the second spinner 160a, e.g., the heat insulating block 164, the first rotor 165, the sidewall portion 168, the bearing 166 and the fixing portion 167. Therefore, the discharge liquid chemical 1710 may be prevented from damaging the heat insulating block 164, the first rotor 165, the sidewall portion 168, the bearing 166 and the fixing portion 167.

The heat insulating block 164 may form sidewalls of the second spinner 160a and may be disposed between the grip portion 161 and the chemical drain guide 163. The heat insulating block 164 may be made of a heat insulating material to prevent the heat received by the grip portion 161 and the chemical drain guide 163 from being transferred to other elements of the second spinner 160a.

Although the heat insulating block 164 is located at a position that is directly coupled to (e.g., contacts) the grip portion 161 and the chemical drain guide 163 in FIG. 9, the invention is not limited to this case. The heat insulating block 164 may be located at any position in the second spinner 160a.

Although the heat insulating block 164 is illustrated as a single element in FIG. 9, the invention is not limited to this case. For example, the heat insulating block 164 may be disposed as a plurality of elements, e.g., at a plurality of places.

The first rotor 165 may rotate the second spinner 160a using magnetic force, e.g., magnetic levitation, as the second rotor 210 to be described later uses magnetic force. Since the first rotor 165 is fixed to the heat insulating block 164, the sidewall portion 168 and the grip portion 161 of the second spinner 160a, the whole of the second spinner 160a may be rotated by the rotation of the first rotor 165. Therefore, the wafer W may also rotate together with the second spinner 160a.

The first rotor 165 may include a magnetic substance. The first rotor 165 may generate a rotational force through a magnetic force/magnetism, together with the second rotor 210 that also includes a magnetic substance. This will be described in more detail later.

The sidewall portion 168 may contact the first rotor 165 to form the sidewalls of the second spinner 160a. In FIG. 9, the sidewall portion 168 is located between the first rotor 165 and the bearing 166. However, the invention is not limited to this case. The sidewall portion 168 may include all portions constituting the sidewalls of the second spinner 160a. Therefore, the sidewall portion 168 may be a single element as in FIG. 9 or may include a plurality of elements.

The bearing 166 may be located between the sidewall portion 168 and the fixing portion 167. However, the position of the bearing 166 is not limited to this position. The bearing 166 may be disposed at any position between the fixing portion 167 that is fixed and the first rotor 165 that rotates. For example, the fixing portion 167 may be a portion that does not move during the cleaning/etching process performed by the fourth wafer cleaning device 13.

The bearing 166 allows the second spinner 160a to rotate. For example, the bearing 166 may be the least element that enables the second spinner 160a to rotate even though the second spinner 160a includes the fixed fixing portion 167. For example, the other parts of the spinner 160a, e.g., the rotor 165 and the sidewall portion 168, may be configured to be movable with respect to the fixing portion 167.

The bearing 166 may rotate as the first rotor 165 rotates. The bearing 166 may simultaneously connect the fixing portion 167 and the sidewall portion 168, the first rotor 165, the heat insulating block 164, the grip portion 161 and the chemical drain guide 163. Therefore, the second spinner 160a may rotate while being fixed in position.

The fixing portion 167 may be disposed at the bottom of the second spinner 160a and may fix and support the second spinner 160a. The fixing portion 167 may not rotate. Instead, the fixing portion 167 may be connected to the bearing 166 so that a part of the second spinner 160a may rotate.

Accordingly, some parts of the second spinner 160a excluding the fixing portion 167 may rotate to rotate the wafer W.

The fixed rotor module 230 may be spaced apart from the second spinner 160a. The fixed rotor module 230 may surround the second spinner 160a, e.g., in a plan view. For example, the fixed rotor module 230 may be located between the chemical drain guide 163 and the first rotor 165. However, the invention is not limited to this case.

The fixed rotor module 230 may include the second rotor 210 and a rotor support 220. Like the first rotor 165 described above, the second rotor 210 may rotate the second spinner 160a using magnetic force, e.g., magnetic levitation. For example, a combination of the first rotor 165 and the second rotor 210 may produce a magnetic force to rotate the second spinner 160a. The second rotor 210 is spaced apart from the heat insulating block 164, the sidewall portion 168 and the grip portion 161 of the second spinner 160a. In addition, the second rotor 210 is connected to the rotor support 220.

The second rotor 210 may include a magnetic substance. The second rotor 210 may generate a rotational force through a magnetic force, together with the first rotor 165.

Figure 10:
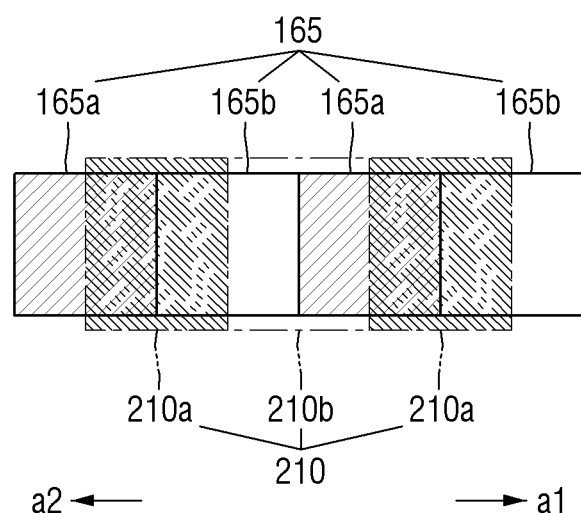
FIG. 10 is a conceptual diagram illustrating and operation of first and second rotors of FIG. 9.

Referring to FIG. 10, the first rotor 165 may include a first rotor first magnetic pole region 165a and a first rotor second magnetic pole region 165b. The first rotor first magnetic pole region 165a and the first rotor second magnetic pole region 165b may have different magnetic poles. For example, the first rotor first magnetic pole region 165a may be a north (N) pole, and the first rotor second magnetic pole region 165b may be a south(S) pole. Alternatively, the first rotor first magnetic pole region 165a may be the S pole, and the first rotor second magnetic pole region 165b may be the N pole.

The first rotor first magnetic pole region 165a and the first rotor second magnetic pole region 165b may be alternately arranged.

Similarly, the second rotor 210 may include a second rotor first magnetic pole region 210a and a second rotor second magnetic pole region 210b. The second rotor first magnetic pole region 210a and the second rotor second magnetic pole region 210b may have different magnetic poles. For example, the second rotor first magnetic region 210a may be the N pole, and the second rotor second magnetic pole region 210b may be the S pole. Alternatively, the second rotor first magnetic pole region 210a may be the S pole, and the second rotor second magnetic pole region 210b may be the N pole.

The first rotor first magnetic pole region 165a may have the same magnetic pole as the second rotor first magnetic pole region 210a. The first rotor second magnetic pole region 165b may have the same magnetic pole as the second rotor second magnetic pole region 210b.

The first rotor first magnetic pole region 165a, the first rotor second magnetic pole region 165b, the second rotor first magnetic pole region 210a and the second rotor second magnetic pole region 210b may be staggered. The first rotor first magnetic pole region 165a, the first rotor second magnetic pole region 165b, the second rotor first magnetic pole region 210a and the second rotor second magnetic pole region 210b may be implemented through, but not limited to, electromagnets.

Since the first rotor first magnetic pole region 165a, the first rotor second magnetic pole region 165b, the second rotor first magnetic pole region 210a and the second rotor second magnetic pole region 210b are staggered, the first rotor 165 may rotate in the first rotation direction a1 and/or the second rotation direction a2.

For example, the first rotor first magnetic pole region 165a and the second rotor first magnetic pole region 210a have forces repulsive to each other, and the first rotor first magnetic pole region 165a and the second rotor second magnetic pole region 210b have forces attractive to each other. Similarly, the first rotor second magnetic pole region 165b and the second rotor second magnetic pole region 210b have forces repulsive to each other, and the first rotor second magnetic pole region 165b and the second rotor first magnetic pole region 210a have forces attractive to each other.

Therefore, the staggered first and second rotors 165 and 210 have a rotational force that causes different regions to face each other. For example, the second spinner 160a comprising the first rotor 165 may rotate such that the first rotor first magnetic pole region 165a and the second rotor second magnetic pole region 210b face each other and that the first rotor second magnetic pole region 165b and the second rotor first magnetic pole region 210a face each other. Then, when the first rotor 165 or the second rotor 210 reverses the alternately arranged magnetic pole regions, the rotation of the second spinner 160a may be further accelerated.

In this way, the second spinner 160a may rotate using magnetic force, e.g., magnetic levitation. Since the fourth wafer cleaning device 13 according to the embodiments generates a rotational force without a contact between the first rotor 165 and the second rotor 210, it is free from mechanical abrasion, and its durability may be enhanced/maintained. In addition, since there is no thermal conduction between the first rotor 165 and the second rotor 210, the fourth wafer cleaning device 13 may have a long life.

The rotor support 220 may be disposed under the second rotor 210 and may support the second rotor 210. The rotor support 220 may be fixed to the second rotor 210. The rotor support 220 may have a fixed position. For example, the rotor support 220 may not move, e.g., with respect to other parts of the fourth wafer cleaning device 13 like the bowl 180 and/or the fixing portion 167, while an etching/cleaning process is performed in the fourth wafer cleaning device 13.

Therefore, the second rotor 210 may be fixed, and the first rotor 165 that may be relatively rotated by the bearing 166 may rotate in the first rotation direction a1 or the second rotation direction a2.

Since the first rotor 165 and the second rotor 210 are magnetic substances, they may be vulnerable to heat. Therefore, a coolant C may move between the first rotor 165 and the second rotor 210 to cool the first rotor 165 and the second rotor 210.

Here, the coolant C may be, but is not limited to, an $N_2$ gas.

Figure 11:
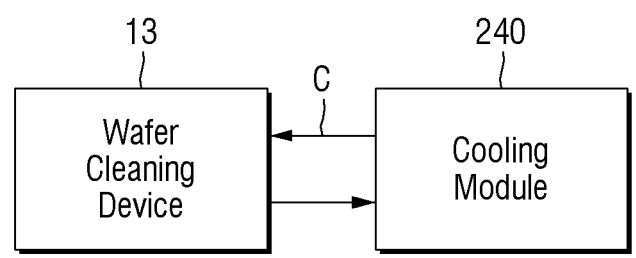
FIG. 11 is a block diagram of a wafer cleaning/etching device according to some embodiments and a cooling module.

FIG. 11 is a block diagram of the fourth wafer cleaning device 13 according to the embodiments and a cooling module 240.

Referring to FIG. 11, the cooling module 240 may provide the coolant C to the fourth wafer cleaning device 13. Accordingly, the fourth wafer cleaning device 13 may cool the first rotor 165 and the second rotor 210.

However, the invention is not limited to this case. For example, the cooling module 240 may be located within the fourth wafer cleaning device 13 according to certain embodiments.

Since the fourth wafer cleaning device 13 according to the embodiments rotates the second spinner 160a using magnetic force, e.g., magnetic levitation, the second spinner 160a may rotate without a contact between the first rotor 165 and the second rotor 210.

Therefore, the durability of the fourth wafer cleaning device 13 may be improved, leading to a longer life. In addition, the wafer W may rotate uniformly and stably due to absence of friction.

A wafer cleaning method according to some embodiments will now be described with reference to FIGS. 1, 3, 12 and 13. Descriptions of elements and features identical to those of the above-described embodiments will be given briefly or omitted.

Figure 12:
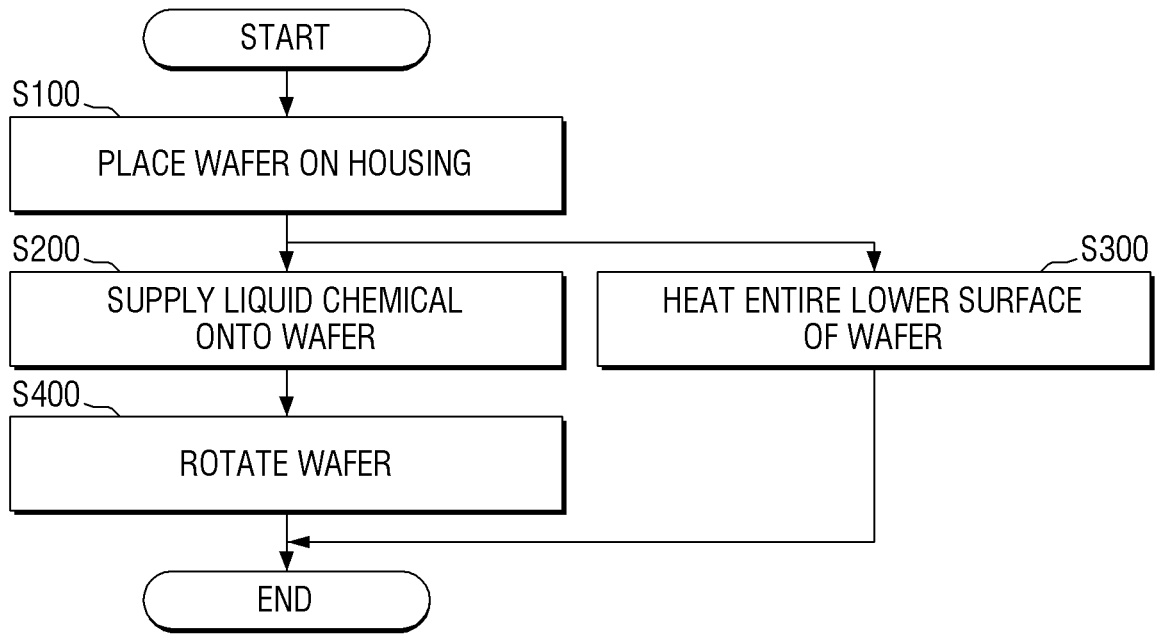
FIG. 12 is a flowchart illustrating a wafer cleaning/etching method according to some embodiments.
Figure 13:
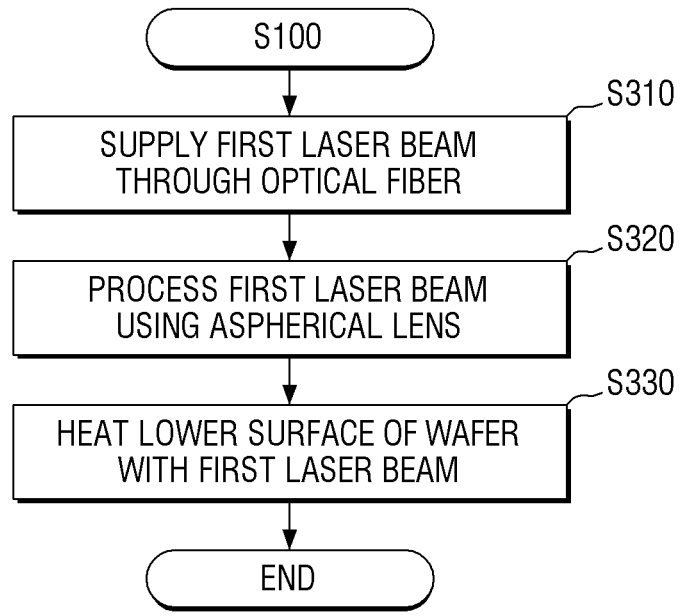
FIG. 13 is a detailed flowchart illustrating a heating operation of the wafer cleaning/etching method according to the embodiments.

FIG. 12 is a flowchart illustrating a wafer cleaning method according to some embodiments. FIG. 13 is a detailed flowchart illustrating a heating operation of the wafer cleaning method according to the embodiments.

Referring to FIG. 12, a wafer is placed on a housing (operation S100).

For example, referring to FIG. 1, a housing 100 may be located under a wafer W. For example, the housing 100 and the wafer W may be arranged successively in the third direction Z. An upper surface of the housing 100 may be adjacent to a lower surface of the wafer W. However, the housing 100 and the wafer W may not contact each other.

A first spinner 160 may contact sides of the wafer W. The first spinner 160 may fix the sides of the wafer W in position and keep the housing 100 and the wafer W spaced apart from each other.

Referring back to FIG. 12, a liquid chemical is supplied onto the wafer (operation S200).

For example, referring to FIG. 1, a nozzle 170 may be placed above the wafer W and the first spinner 160. The nozzle 170 may supply a liquid chemical 171 onto an upper surface of the wafer W. The nozzle 170 may drop the liquid chemical 171 onto a central portion of the wafer W. As the wafer W rotates, the dropped liquid chemical 171 may be spread over the entire upper surface of the wafer W.

Referring back to FIG. 12, the wafer is rotated (operation S400).

For example, referring to FIG. 1, the first spinner 160 may rotate the wafer W while holding the wafer W on the sides of the wafer W. As the first spinner 160 rotates in a first rotation direction a1 or a second rotation direction a2, the wafer W may also rotate in the same direction.

When the wafer W rotates along with the first spinner 160, the liquid chemical 171 supplied onto the upper surface of the wafer W may evenly spread on the upper surface of the wafer W. The rotation of the wafer W along with the first spinner 160 may help the upper surface of the wafer W have a uniform etch rate.

Although the supplying of the liquid chemical onto the wafer (operation S200) and the rotating of the wafer (operation S400) are illustrated as sequential operations in FIG. 12, the invention is not limited to this case. For example, the supplying of the liquid chemical onto the wafer (operation S200) and the rotating of the wafer (operation S400) may be performed simultaneously.

Referring back to FIG. 12, the entire lower surface of the wafer is heated (operation S300). This may be performed at the same time as the supplying of the liquid chemical onto the wafer (operation S200) and the rotating of the wafer (operation S400). Here, "at the same time" does not mean that different operations are performed at exactly the same time but may include a case where execution times of different operations partially overlap. For example, "at the same time" may refer to a case where the execution times of different operations performed independently overlap.

For example, referring to FIG. 1, a laser module 110 may be disposed inside the housing 100. The lase module 110 may radiate a laser beam from under the wafer W to the lower surface of the wafer W. The laser module 110 may be located under a hollow region 140 or at a bottom of the hollow region 140. A first laser beam L1 radiated by the laser module 110 may pass through the hollow region 140 and a transparent window 150 to reach the lower surface of the wafer W. Therefore, the entire lower surface of the wafer W may be heated. For example, the wafer W may be heated by radiating the first laser beam L1 to the lower surface of the wafer W.

Referring to FIG. 13, a first laser beam is supplied through an optical fiber (operation S310).

For example, referring to FIG. 1, a laser beam of the laser module 110 may be supplied through an optical fiber 111. The optical fiber 111 may be connected to the outside so as to form a path through which a laser beam is supplied.

Referring back to FIG. 13, the first laser beam is processed using an aspherical lens (operation S320).

For example, referring to FIGS. 1 and 3, the first laser beam L1 supplied by the optical fiber 111 may have a Gaussian profile Lg. The Gaussian profile Lg of the first laser beam L1 may be converted into a first output profile Lo1 as the first laser beam L1 passes through an aspherical lens 120. Referring to the first output profile Lo1, a uniform energy E may be supplied to/throughout the entire lower surface of the wafer W, which corresponds to a second width d2, regardless of a distance d, e.g., as shown in FIG. 3.

In certain embodiments, the wafer cleaning device may process the first laser beam L1 to a profile different from the first output profile Lo1, if necessary.

Referring back to FIG. 13, the lower surface of the wafer is heated with the first laser beam (operation S330).

For example, referring to FIG. 1, the first laser beam L1 may pass through the hollow region 140 and the transparent window 150 to reach the lower surface of the wafer W. The first laser beam L1 may heat the entire lower surface of the wafer W.

A wafer cleaning method according to some embodiments will now be described with reference to FIGS. 1, 12 and 14. Descriptions of elements and features identical to those of the above-described embodiments will be given briefly or omitted.

The current embodiments may be the same as the above-described embodiments in the operations illustrated in FIG. 12. Therefore, among the operations illustrated in FIG. 12, only the operation of heating the entire lower surface of the wafer (operation S300) will be described in detail again.

Figure 14:
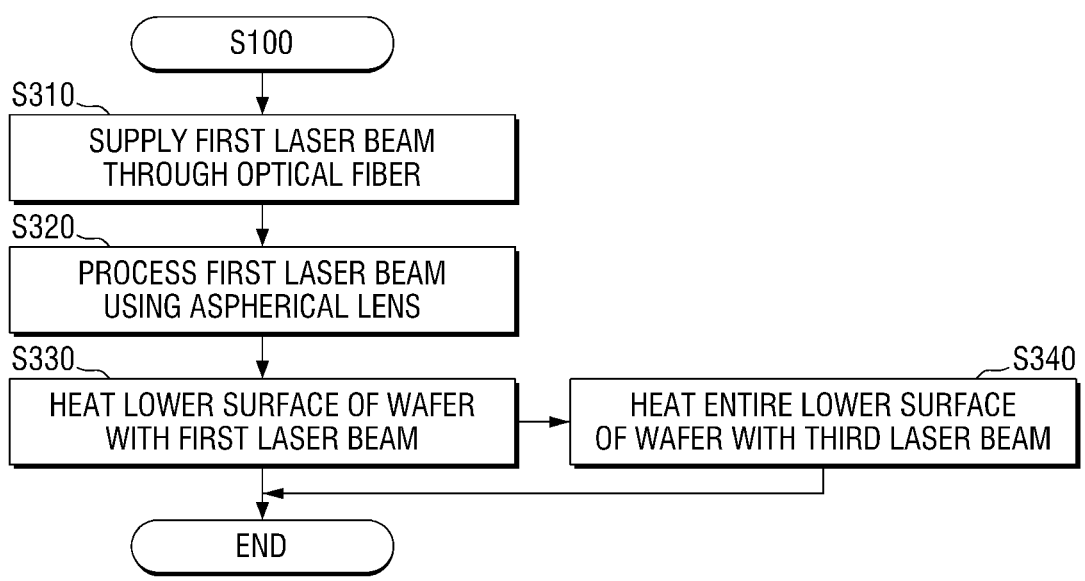
FIG. 14 is a detailed flowchart illustrating a heating operation of a wafer cleaning/etching method according to some embodiments.

FIG. 14 is a detailed flowchart illustrating a heating operation of a wafer cleaning method according to some embodiments. Supplying a first laser beam through an optical fiber (operation S310), processing the first laser beam using an aspherical lens (operation S320) and heating a lower surface of a wafer with the first laser beam (operation S330) are the same as those of FIG. 13. Therefore, only the operation of heating the lower surface of the wafer with a third laser beam which is different from FIG. 13 will be described.

Referring to FIG. 14, the lower surface of the wafer is heated with the third laser beam (operation S340).

For example, referring to FIG. 1, the hollow region 140 may be hemispherical. The hollow region 140 may be formed in a hemispherical shape because a second laser beam L2 generated by the reflection of the first laser beam L1 by the lower surface of the wafer W should be reflected by a reflective plate 130. Therefore, a third laser beam L3 generated by the reflection of the second laser beam L2 by the reflective plate 130 may efficiently reach the lower surface of the wafer W.

While the present inventive concept has been particularly shown and described with reference to exemplary embodiments thereof, it will be understood by those of ordinary skill in the art that various changes in form and details may be made therein without departing from the spirit and scope of the present inventive concept as defined by the following claims. It is therefore desired that the present embodiments be considered in all respects as illustrative and not restrictive, reference being made to the appended claims rather than the foregoing description to indicate the scope of the invention.

What is claimed is:

1. A method comprising:
   providing a housing, including a hollow formed in the housing;
   providing a laser module configured to radiate a laser beam, the laser module disposed in the hollow;
   providing a grip configured to hold a wafer;
   providing a transparent window disposed at a top of the hollow to seal the hollow, the transparent window positioned to transmit the laser beam,
   wherein the transparent window is positioned adjacent to a lower surface of the wafer; and
   heating the wafer using the laser module by irradiating the entire lower surface of the wafer using the laser beam,
   wherein a bottom surface of the wafer is not connected to an upper surface of the transparent window while the laser beam heats the wafer, and
   wherein the laser module is vertically aligned with a center of the wafer.

2. The method of claim 1, wherein the laser module comprises:
   an optical fiber configured to supply the laser beam; and
   an aspherical lens configured to change a profile of the laser beam emitted from the optical fiber.

3. The method of claim 2, further comprising a reflective plate disposed along a bottom of the hollow.

4. The method of claim 3, wherein the aspherical lens is designed in consideration of a curvature of the reflective plate so that the laser beam is uniformly radiated to the lower surface of the wafer.

5. The method of claim 1, further comprising a spinner configured to contact sides of the wafer, the spinner configured to rotate the wafer.

6. The method of claim 5, further comprising a first rotor and a second rotor,
   wherein the spinner comprises the first rotor which comprises a magnetic substance,
   wherein the second rotor comprises a magnetic substance,
   wherein the second rotor is spaced apart from the spinner, and
   wherein the second rotor is configured to rotate the first rotor.

7. The method of claim 5, wherein the spinner is configured to rotate together with the wafer.

8. The method of claim 1, wherein the hollow is hemispherical.

9. A method of manufacturing a semiconductor device, the method comprising:
   placing a wafer above a housing by holding the wafer with a spinner on sides of the wafer;
   supplying a liquid chemical onto the wafer;
   rotating the wafer using the spinner to evenly spread the liquid chemical on an upper surface of the wafer; and
   heating the wafer with a first laser beam radiated from a laser module disposed in the housing,
   wherein the laser module is vertically aligned with a center of the wafer.

10. The method of claim 9, wherein the supplying of the liquid chemical onto the wafer, the rotating of the wafer, and the heating of the wafer are performed simultaneously.

11. The method of claim 9, wherein the heating of the wafer comprises irradiating the entire lower surface of the wafer with the first laser beam and a third laser beam generated by reflection of a second laser beam,
    wherein the second laser beam is a laser beam generated by reflection of the first laser beam by the lower surface of the wafer, and
    wherein the third laser beam is a laser beam generated by reflection of the second laser beam by a reflective plate disposed along a bottom of a hollow formed in the housing.

12. The method of claim 9, wherein the heating of the wafer comprises:
    supplying the first laser beam through an optical fiber; and
    processing the first laser beam using an aspherical lens and letting the processed first laser beam reach a lower surface of the wafer.

13. The method of claim 9, wherein the liquid chemical etches SiN or polysilicon formed on the upper surface of the wafer.

* * * * *